(12) United States Patent
Mauder et al.

(10) Patent No.: US 8,564,098 B2
(45) Date of Patent: Oct. 22, 2013

(54) CONTROLLING THE RECOMBINATION RATE IN A BIPOLAR SEMICONDUCTOR COMPONENT

(75) Inventors: Anton Mauder, Kolbermoor (DE); Franz Hirler, Isen (DE); Frank Pfirsch, Munich (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 551 days.

(21) Appl. No.: 12/718,381

(22) Filed: Mar. 5, 2010

(65) Prior Publication Data

US 2011/0215858 A1      Sep. 8, 2011

(51) Int. Cl.
*H01L 21/02* (2006.01)

(52) U.S. Cl.
USPC ............... 257/590; 257/E29.171; 257/565; 257/130

(58) Field of Classification Search
USPC ......... 257/130, 131, 155, 156, 162, 565–593, 257/E29.171
See application file for complete search history.

(56) References Cited

U.S. PATENT DOCUMENTS

| | | | | |
|---|---|---|---|---|
| 4,559,551 A | * | 12/1985 | Nakagawa | 257/156 |
| 4,754,315 A | * | 6/1988 | Fisher et al. | 257/583 |
| 6,465,871 B2 | * | 10/2002 | Minato | 257/617 |
| 6,781,156 B2 | * | 8/2004 | Drobnis et al. | 257/77 |
| 7,485,920 B2 | * | 2/2009 | Francis et al. | 257/328 |
| 2006/0022306 A1 | | 2/2006 | Bromberger | |
| 2009/0282252 A1 | | 11/2009 | Hoehne | |

FOREIGN PATENT DOCUMENTS

| | | |
|---|---|---|
| CN | 101345405 A | 1/2009 |
| CN | 101494239 A | 7/2009 |
| DE | 10057611 C2 | 10/2002 |
| JP | 8340101 A | 12/1996 |

* cited by examiner

*Primary Examiner* — Matthew Landau
*Assistant Examiner* — Candice Y Chan
(74) *Attorney, Agent, or Firm* — Murphy, Bilak & Homiller, PLLC

(57) ABSTRACT

Disclosed is a method for controlling the recombination rate in the base region of a bipolar semiconductor component, and a bipolar semiconductor component.

20 Claims, 5 Drawing Sheets

CONTROLLING THE RECOMBINATION RATE IN A BIPOLAR SEMICONDUCTOR COMPONENT

TECHNICAL FIELD

Embodiments of the present invention relate to a bipolar semiconductor component, and in particular to controlling the recombination rate in the base region of a bipolar semiconductor component.

BACKGROUND

Bipolar components, such as IGBTs, bipolar transistors, diodes, or thyristors, include two complementarily doped emitters and at least one base region that is lower doped than the emitters and that is arranged between the emitters.

In the on-state of the component, the two emitters emit charge carriers of different types, i.e., p-type and n-type charge carriers, that form a charge carrier plasma. A large number of charge carriers in the base region, i.e., a high density of the charge carrier plasma, results in a low on-resistance of the component. However, a high plasma density in the on-state results in high switching losses when the component switches off. Further, a high plasma density in the on-state may reduce the robustness of the component.

There is therefore a need for a bipolar semiconductor component, such as an IGBT, a bipolar transistor, a diode or a thyristor, that has a low on-resistance in its on-state, and that has a low switching loss in the transition from the on-state into the off-state.

SUMMARY

One embodiment of the present invention relates to a method for controlling the recombination rate in a bipolar semiconductor component operable to enter an on-state or an off-state and that comprises a base region in which in the on-state a charge carrier plasma with p-type and n-type charge carriers is present. The method includes providing a recombination rate control structure. The control structure includes a dielectric layer adjoining the base region, a control electrode separated from the base region by the dielectric layer, and recombination centers. The method further includes applying a control voltage between the control electrode and the base region after the semiconductor component enters the on-state and before the semiconductor component enters the off-state. The control voltage is selected such that an electric field is generated in the base region that reduces the concentration of charge carriers of one of the n-type and p-type in the region of the recombination centers.

A further embodiment relates to a bipolar semiconductor component operable to enter an on-state or an off-state. The component includes: a base region that is adapted in the on-state to accommodate a charge carrier plasma with p-type and n-type charge carriers; an recombination rate control structure, the control structure comprising a dielectric layer adjoining the base region, a control electrode separated from the base region by the dielectric layer, and recombination centers. The component further includes a drive circuit for the recombination rate control structure that is adapted to apply a control voltage between the control electrode and the base region after the semiconductor component enters the on-state and before the semiconductor component enters the off-state. The control voltage is selected such that an electric field is generated in the base region, with the electric field reducing the concentration of charge carriers of one of the p-type and n-type in the region of the recombination centers.

BRIEF DESCRIPTION OF THE DRAWINGS

Embodiments will now be explained with reference to the drawings. The drawings serve to illustrate the basic principle. Thus, only aspects necessary for understanding the basic principle are illustrated. The drawings are not necessarily to scale. Like reference characters denote like features throughout the drawings.

DETAILED DESCRIPTION

Figure 1:
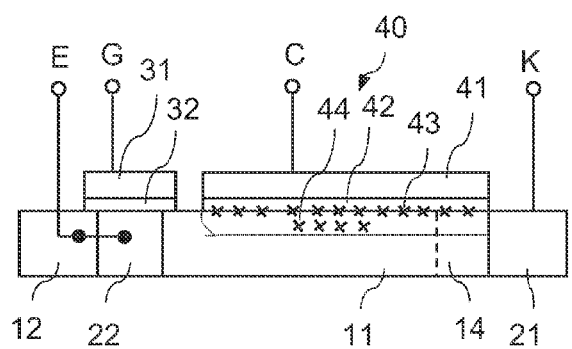
FIG. 1 illustrates an embodiment of a bipolar semiconductor component implemented as an IGBT, and including a recombination rate control structure.

FIG. 1 schematically illustrates a cross section through a bipolar semiconductor component that, in the present embodiment, is implemented as an IGBT. This component includes a first base region 11 of a first conductivity type, a first emitter region 12 of the first conductivity type, and a second emitter region 21 of a second conductivity type. The base region 11 is arranged between the first and the second emitter regions 12, 21 and has a lower doping concentration than the emitter regions 12, 21. Doping concentrations of the first and second emitter regions 12, 21 are, for example, in the range of between $10^{15}$ cm$^{-3}$ and $10^{21}$ cm$^{-3}$, where the second emitter region 21 can be doped lower than the first emitter region 12. The doping concentration of the first base region 11 is, for example, in the range of between $10^{12}$ cm$^{-3}$ and $10^{15}$ cm$^{-3}$. The doping concentration of the first base region 11 and its dimension in a current flow direction of the component significantly influences the voltage blocking capability of the component.

In an IGBT, such as the IGBT illustrated in FIG. 1, the first base region 11 is also referred to as drift region, the first emitter region 12 is also referred to as source or emitter region, and the second emitter region 21 is also referred to as drain or collector region. The IGBT can enter an on-state or an off-state. For switching the component on and off the component includes a switching state control structure. This control structure includes a second base region 22 doped complementarily to the first emitter region (source region) 12 and the first base region (drift region) 11. The second base region 22, that is also referred to as a body region, is arranged between the first emitter region 12 and the first base region 11. The switching state control structure further includes a gate electrode 31 that is arranged adjacent to the body region 22 and that is isolated from the body region 22 by a gate dielectric 32. Gate electrode 31 is adapted to control an inversion channel along the gate dielectric 32 in the body region 22 between the first emitter region 12 and the first base region 11. The component is in its on-state when there is an inversion channel in the body region 22, and is in its off-state when the inversion channel is interrupted.

The structure explained so far is the structure of a common IGBT that can be switched into its on-state or off-state by applying a suitable control voltage between a gate terminal G that contacts the gate electrode 31 and an emitter or source terminal E that contacts the first emitter region 12. For a better understanding of the invention, the basic operation principle of an IGBT will be explained first.

For explanation purposes, it is assumed that the first base region 11 and the first emitter region 12 are n-doped semiconductor regions, and that the body region 22 and the second emitter region 21 are p-doped regions. The component is in its on-state when a positive voltage is applied between a collector or drain terminal K, that contacts the second emitter region 21, and the source or emitter terminal E, and when a positive voltage is applied between the gate terminal G and the emitter terminal E. In the on-state the first emitter region 12 emits n-type charge carriers through the inversion channel in the body region 22 into the first base region 11, and the second emitter region 21 emits p-type charge carriers into the first base region 11. These n-type and p-type charge carriers form a charge carrier plasma in the first base region 11. This charge carrier plasma results in a low on-resistance of the component.

However, when the component is switched off, i.e., when the inversion channel in the body region 22 is interrupted by suitably driving gate electrode 31, this charge carrier plasma needs to be removed from the first base region 11 in order for the component to block. Since removing the charge carrier plasma takes some time, there is a time delay between the time of interrupting the inversion channel and the time of completely switching the component off. This delay time, in which the component is gradually switched off, and the current flowing during this delay time results in switching losses.

In order to decrease this delay time, and in order to decrease the switching losses, the bipolar semiconductor component further includes a recombination rate control structure 40. The recombination rate control structure 40 includes a control electrode 41 that is arranged adjacent to the first base region 11, and a dielectric layer 42 that is arranged between the control electrode 41 and the first base region 11. The recombination rate control structure 40 further includes recombination centers 43, 44. The recombination centers 43, 44 are arranged at an interface between the dielectric layer 42 and the first base region 11. Alternatively or additionally, recombination centers 44 are arranged in the first base region 11 distant to the dielectric layer 42.

Recombination centers are, for example, crystal damages of the semiconductor crystal in which the first base region 11 is implemented, or heavy metal atoms, such as gold (Au) or platinum (Pt) atoms present in the semiconductor crystal. Crystal damages can be generated in the semiconductor crystal by, for example, implanting atoms or ions into the semiconductor crystal, such as helium ions, protons, semiconductor atoms, like silicon atoms, or argon atoms. Further, dangling bonds that are inevitably present in the interface region between the semiconductor crystal of the first base region and the dielectric layer may act as recombination centers.

The dielectric layer is, for example, an oxide layer, such as a silicon oxide ($SiO_2$) layer, a nitride layer, such as a silicon nitride ($Si_3N_4$) layer, or an oxynitride layer, or is a layer stack including layers of at least two of these materials. An oxynitride is a compound including silicon, oxygen and nitrogen, and has the formula $Si_xO_yN_z$. The concentration of recombination centers in the interface region between the dielectric layer 42 and the first base region 11 can be adjusted by suitably selecting the process parameters when growing or depositing the dielectric layer 42 on the base region 11.

The concentration of recombination centers can, e.g., be influenced by the concentration of dangling bonds at the semiconductor surface. For example, by thermally growing a stoichiometric silicon oxide ($SiO_2$) layer as the dielectric layer on top of the semiconductor crystal forming the base region and by minimizing the non-stoichiometric transition region between the semiconductor crystal and $SiO_2$ the concentration of recombination centers can be minimized. A suitable process for producing a dielectric layer and, thereby, minimizing the recombination centers includes: cleaning of the semiconductor surface; thermally growing an oxide, such as silicon oxide ($SiO_2$), in an oxygen-($O_2$)-containing atmosphere, partially in presence of hydrochloric acid (HCl), at temperatures in the range of between 950° C. and 1050° C.; annealing in an inert atmosphere, such as a nitrogen ($N_2$) containing atmosphere at the same or at a slightly reduced temperature; a cooling step; and finally cooling the device after the process in an oxygen containing or even a humidity containing atmosphere. Contaminations on the semiconductor surface before growing the oxide layer, deposition of one or more of an $SiO_2$ layer, a $Si_3N_4$ layer, or a $Si_xO_yN_z$ layer, or generation of dislocations in the crystal lattice can increase the density of recombination centers.

Oxidation related centers are known, e.g., as $P_b$ or $P_{b0}$ centers. In order to reduce the concentration of recombination centers in a semiconductor layer after producing an oxide layer, a hydrogen annealing, i.e., an annealing in a hydrogen containing atmosphere, such as a HCl containing atmosphere, can be performed. Hydrogen annealing is suitable for neutralizing recombination centers to a great extent. Thus, by not performing such hydrogen annealing after an oxidation process for producing an oxide layer as a dielectric layer, or by suitably adjusting the duration and temperature of the hydrogen annealing step the concentration of recombination centers can be adjusted. Alternatively, those sections of the dielectric layer 42 in the region of which a higher concentration of recombination centers is desired are covered by a diffusion barrier during a hydrogen annealing step.

Further, recombination centers in an interface region between an oxide layer and a semiconductor layer can be produced by nitrating the oxide layer.

It is commonly known that recombination centers promote recombination of n-type and p-type charge carriers in a semiconductor region, such as the first base region 11. When the component is in its on-state a high recombination rate is not desired in the first base region 11, because charge carriers that recombine do not contribute to the current conduction. Thus, with increasing recombination rate the on-resistance of the component increases. However, at the time or on the verge of switching off the semiconductor component a high recombination rate is desired, because charge carriers that recombine in the first base region 11 do not have to be removed from the base region 11 via the first and second emitter regions 12, 21.

A high recombination rate at or shortly before the time of switching off therefore helps to reduce switching losses of the component.

The recombination rate U in a semiconductor region, such as first base region 11, is given by:

$$U = \frac{v_{th}\sigma_n\sigma_p N_t(p_n n_n - n_i^2)}{\sigma_p[p_n + n_i e^{(E_i-E_t)/kT}] + \sigma_n[n_n + n_i e^{(E_t-E_i)/kT}]} \quad (1)$$

(See Sze: "Semiconductor devices, physics and technology," 2nd edition, John Wiley & Sons, 2002, page 46, eq. 48). Here, $v_{th}$ is the thermal velocity of carriers, $N_t$ is the concentration of recombination centers in the semiconductor region, $\sigma_n$ is the capture cross section of electrons, $\sigma_p$ is the capture cross section of holes, $p_n$ is the concentration of holes or p-type charge carriers, respectively, $n_n$ is the concentration of electrons or n-type charge carriers, respectively, $n_i$ is the intrinsic concentration, $E_t$ is the energy level of the recombination center, $E_i$ is the Fermi level, k is the Boltzmann constant and T is the absolute temperature.

It can be seen from equation (1) that the concentrations $p_n$ of p-type charge carriers and $n_n$ of n-type charge carriers in the region around the recombination centers significantly influence the recombination rate. If the concentration of one charge carrier type is very low compared to the concentration of the other charge carrier type the recombination rate U is also very low (due to the term $p_n n_n$ in the numerator of the term on the right side of equation (1)). With constant other parameters there is a maximum of the recombination rate when the concentrations $p_n$ of p-type charge carriers and $n_n$ of n-type charge carriers are approximately equal, i.e., when $p_n=n_n$.

The recombination rate control structure 40 of FIG. 1 uses the dependency of the recombination rate U on the concentrations of p-type and n-type charge to control the recombination rate of carriers in regions around the recombination centers in the first base region 11. The control electrode 41 of the recombination rate control structure 40 can be used to control a depletion region adjacent to the dielectric layer 42, where this depletion region is depleted of charge carriers of one type. "Depleted" in this connection means that the concentration of charge carriers of one type in the depletion region is reduced compared to the concentration of the other type. If an electric field is used for depleting the region close to the dielectric layer 42, then this dielectric field results in an increase of the concentration of the other carrier type. The depletion region can be an n-type depletion region, which is a depletion region which is depleted of n-type charge carriers, or a p-type depletion region, which is a depletion region depleted of p-type charge carriers.

Thus, when there is a p-type depletion region p-type charge carriers of the charge carrier plasma, that is present in first base region 11 when the component is in its on-state, are "kept away" from the recombination centers 43, 44, and when there is an n-type depletion region n-type charge carriers of the charge carrier plasma are kept away from the recombination centers. In both cases, the recombination rate of p-type and n-type charge carriers is significantly reduced compared with the situation when there is no depletion region, which is when charge carriers of both types are present in the region around the recombination centers.

Generally the n-type or p-type depletion regions can be controlled by applying a control voltage, that will be referred to as recombination rate control voltage, between the control terminal C, that contacts control electrode 41, and the first base region 11. The state of the component in which there is a depletion region will be referred to as "state with a first recombination rate" in the following, and the state when there is no depletion region will be referred to as "state with a second recombination rate" or "state with an increased recombination rate" in the following. The recombination rate control voltage that is required in order to obtain the state with the first or second recombination rate is dependent on the type of the recombination rate control structure. When there are no fixed charges in the dielectric layer, then there is no depletion region at a small or at zero control voltage. Thus, the second recombination rate is obtained at small or zero control voltages. In this case, a p-type depletion region can be obtained by applying a positive voltage between the control terminal C and the first base region 11, and an n-type depletion region can be obtained by applying a negative control voltage between the control terminal C and the first base region 11. In both of these cases, the first (lower) recombination rate is obtained. Due to a small voltage drop between the source and the drain region when the component is in its on-state, the effective voltage across the dielectric layer 42 as well as the amount of depletion, i.e., the width of the depletion region, may vary slightly.

According to an embodiment there are fixed charges in the dielectric layer 42. These charges affect an electric field in the base region 11 at small or at zero recombination rate control voltages. It is dependent on the charge concentration, whether these trapped charges are sufficient to result in a depletion region. Assume that these charges result in a depletion region, then the recombination rate control voltage required for obtaining the first recombination rate is zero. For obtaining the second recombination rate, control voltages are to be applied that are unequal to zero and that compensate the electric field that result from the trapped charges. Assuming, for example, that there are positive charges, then it is necessary to apply a negative voltage in a certain range to the control terminal C compared to the potential in the first base region 11 in order to obtain the second recombination rate. Applying a control voltage that is too low or too high will result in a depletion of holes and electrons, respectively, and, therefore, in a reduced recombination rate.

The recombination rate control voltage is selected such that the recombination centers 43, 44 lie within the depletion region generated by applying the recombination rate control voltage between the control terminal C and the first base region 11, where the value of the control voltage can be small or zero when there are trapped charges in the dielectric layer. When the recombination centers 43 are located at the interface between the dielectric layer 42 and the first base region 11, a depletion region is required that, starting from the dielectric layer 42, extends less deep into the first base region 11 compared to those cases where recombination centers are arranged distant to the dielectric layer 42. The amplitude of the control voltage is about a few to several volts and is, for example, in the range of between 0V and 20V, in particular between 1V and 10V, or between 1V and 5V.

Referring to Eq. 1, the capture cross section in combination with the recombination center concentration influences the recombination rate. Carriers that are within the capture cross section of a recombination center can recombine. Thus, in order to reduce the recombination rate the depletion region should be generated such that it extends beyond the capture cross sections of the recombination centers.

Figure 2:
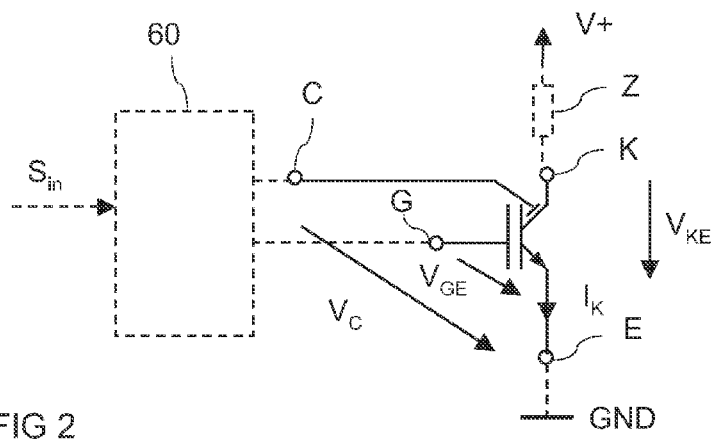
FIG. 2 illustrates an embodiment of a circuit arrangement including a bipolar semiconductor component having a recombination rate control structure.

An embodiment of a method for controlling the recombination rate in the first base region 11 will now be explained with reference to FIGS. 2 and 3. FIG. 2 shows the electric circuit symbol of an IGBT according to FIG. 1. The electric circuit symbol is based on the circuit symbol of a conventional IGBT and has a gate terminal G, a collector terminal K and an emitter terminal E. Further, there is the control terminal C for applying the recombination rate control voltage $V_C$. This control voltage $V_C$ can either be applied between the control terminal C and the base region 11, or can be applied between the control terminal C and one of other regions of the IGBT that are electrically coupled with the first base region 11. Control voltage $V_C$ is, for example, applied between control terminal C and the emitter terminal E, where the emitter terminal E electrically contacts both (source region 12 and body region 22). In FIG. 2 $V_{GE}$ is the gate control voltage for switching on or off the component, $V_{KE}$ is load-path voltage (collector-emitter voltage), and $I_K$ is the load current flowing through the bipolar semiconductor component.

Assume, for explanation purposes, that the component has its load-path (collector-emitter path) connected in series with a load Z between terminals for a first supply potential and a second supply potential V+, GND. In the embodiment of FIG. 2 the semiconductor component is connected as a Low-Side switch, i.e., the semiconductor component has its load-path connected between the load Z and the terminal GND for the negative supply potential or reference potential GND, respectively. However, this is only an example. The operating principle that will be illustrated in the following does also apply to semiconductor components that are connected as High-Side switches, or to semiconductor components that are connected as switches in half-bridge or full-bridge circuits.

For the following explanation, it is further assumed that the first base region 11 and the first emitter region 12 are n-type semiconductor regions and that the second base region (body region) 22 and the second emitter region 22 are p-type regions. However, the following explanations do also apply to components that have their semiconductor regions doped complementarily. In this case, the polarities of the voltages explained in the following have to be changed.

The component is switched on—like a conventional IGBT—by applying a positive voltage between the collector and emitter terminal K, E, and by applying a control potential at the gate electrode 31 that is suitable for generating a conducting channel (inversion channel) in the body zone 22 between the first emitter region 12 and the first base region 11. When the component is switched on the first emitter region 12 emits charge carriers of a first type, such as n-type charge carriers, into the first base region 11, and the second emitter region 21 emits charge carriers of a second type, such as p-type charge carriers, into the base region 11. These charge carriers form a charge carrier plasma in the first base region 11.

The component is switched off, when the inversion channel in the body region 22 is interrupted by suitably driving gate electrode 31. The gate potential, i.e., the potential of the gate electrode 31 is, for example, a potential relative to the potential of the emitter electrode E or the first emitter region 12 respectively. For generating an inversion channel, a gate potential that is positive relative to the emitter potential, or a positive gate-emitter voltage $V_{GE}$, is applied. For interrupting the inversion channel, the gate potential is, for example, a potential that is equal to the emitter potential or that is below the emitter potential. When the component is in its off-state a space charge region propagates in the first base region 11 starting from the pn-junction between the body region 22 and the first base region 11. At the same time the charge carriers that form the charge carrier plasma 11 in the first base region 11 have to be removed from the first base region, where p-type charge carriers flow in the direction of the n-emitter 12, and n-type charge carriers flow in the direction of the p-emitter 21.

Figure 3:
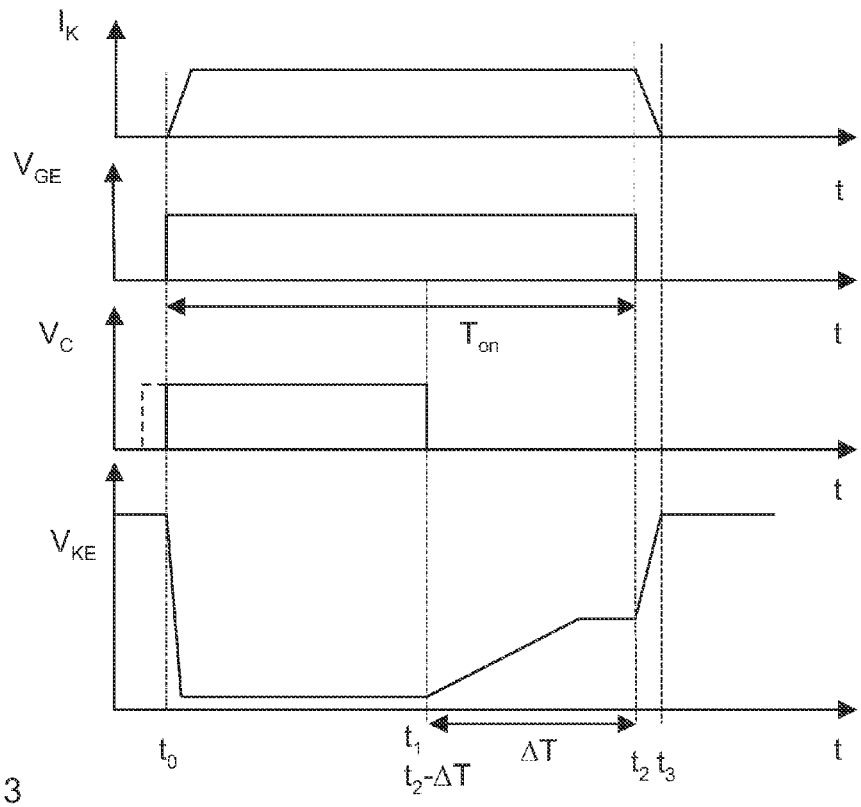
FIG. 3 illustrates the operating principle of the component according to FIG. 1 by way of timing diagrams.

In FIG. 3, $t_0$ denotes a time at which the gate-emitter voltage $V_{GE}$ assumes an on-level, which is a level that switches the component on. Starting at this time the load path voltage $V_{KE}$ decreases until it reaches a minimum value, and the collector current $I_K$ increases. The component is completely switched on when the collector-emitter voltage $V_{KE}$ assumes its minimum voltage, and when the collector current $I_K$ assumes its maximum value, where the maximum value of the collector current $I_K$ is, amongst others, dependent on the type of load Z.

When the component is switched on it is desired to have a low-on resistance and, therefore, to have a low recombination rate. Thus, the recombination rate control structure 40 by applying a suitable control voltage $V_C$ between the control terminal C and the first base region 11 is driven such that the recombination rate is kept low, i.e., the recombination rate is the first recombination rate. In the example illustrated in FIG. 3 the control voltage $V_C$ has two possible signal levels: a first signal level, which is a high level in the present example; and a second level, which is a low level in the present example. For explanation purposes it is assumed that the first signal level of the recombination rate control voltage $V_C$ represents the first (or low) recombination rate, and that the second signal level of the recombination rate control voltage $V_C$ represents the second (or increased) recombination rate. The first signal level is selected such that there is a depletion region of one type in the first base region 11. During the time, when the control voltage $V_C$ has its first signal level the effectiveness of the recombination centers 43, 44 is reduced, because charge carriers of one type are kept away from the recombination centers.

The effectiveness of the recombination centers 43, 44 is, however, increased when the recombination rate control voltage assumes the second signal level. Referring to FIG. 3 the control voltage $V_c$ assumes the second level at a time $t_1$ before the component is switched off. In FIG. 3, $t_2$ denotes the time when the component is switched off, which is the time when the inversion channel in the body region 22 is interrupted by switching the gate-emitter-voltage off. However, although at time $t_2$ the load-path voltage starts to increase, the component completely blocks at a later time $t_3$ when the collector current $I_K$ has decreased to zero.

The delay time between the time $t_2$ when the switching control voltage $V_{GE}$ is switched off and the time $t_3$ when the component blocks, is, among others, dependent on the density of the charge carrier plasma that is present in the first base region 11 at the time before the component is switched off. This delay time (between $t_2$ and $t_3$) and therefore, the switching loss can be decreased by increasing the recombination rate in the first base region 11 before the time $t_2$, when the component is switched off. The recombination rate is increased by switching the recombination rate control voltage $V_C$ to the second signal level at time $t_1$ before switching-off time $t_2$. Increasing the recombination rate results in an increased on-resistance and, therefore, in an increased load-path voltage $V_{KE}$. However, by suitably selecting a time difference $\Delta T$ between the time of increasing the recombination rate control voltage and the time $t_2$ of switching off the component, the loss resulting from the increased on-resistance can be made low compared to the reduction of switching loss that is obtained by increasing the recombination rate.

Referring to FIG. 3 the recombination rate control voltage $V_C$ can be switched to its first signal level at the time $t_0$ when the component is switched on. However, it is also possible to switch the recombination rate control voltage $V_C$ to its first signal level before the component is switched on (illustrated in dashed lines). The time difference $\Delta T$ is, for example, in a range of several μs and can be adjusted to the load current which influences the carrier charge density $T_{on}$ denotes the on-time, which is the time when the switching control voltage $V_{GE}$ assumes its on-level. The time $T_{on}$-$\Delta T$ when both, the component is switched on and the recombination rate is low, can be between about 50% and 99% of the on-time $T_{on}$, e.g., $\Delta T$ is between about 1% and 50% of the on-time $T_{on}$.

The switching control voltage $V_{GE}$ and recombination rate control voltage $V_C$ are, for example, generated by a drive circuit 60 (illustrated in dashed lines in FIG. 2) that generates these control voltages dependent on an input signal $S_{in}$. The input signal $S_{in}$ is, for example a signal provided by a control circuit, such as a microcontroller. The input signal $S_{in}$ is, for example, a signal that in general determines the on-times and off-times of the semiconductor component, while the drive circuit 60 generates the control voltages $V_{GE}$ and $V_C$ in accordance with the timing diagrams of FIG. 3 in such a manner that the on-times $T_{on}$ and off-times correspond to the times given by the input signal $S_{in}$ and that there are time periods during the on-times that are shorter than on-times and during which the recombination rate is increased.

The bipolar semiconductor component has a current flow direction, which is the direction in which in its on-state a current flows through the first base region 11, and which is the direction from one 12 of the emitter regions to the other one 21 of the emitter regions. The recombination rate control structure 40 may extend completely along the base region 11 between the body region 22 and the second emitter region 21, or may extend along only sections of the first base region 11 in the current flow direction.

When the component is in its off-state the load-path voltage applied between the collector K and the emitter E terminal essentially drops across the first base region 11. Dependent on the dimension of the first base region 11 in the current flow direction and dependent on its doping concentration the voltage blocking capability of the component can be in the range of up to several hundred or thousand volts. When the component is in its off-state and the recombination rate control electrode 41 is kept on a constant potential, such as emitter potential, for example, a voltage drops across the dielectric layer 42. This voltage varies in the current flow direction and has its maximum close to the second emitter region 21. The maximum voltage drop is equal to about the load path voltage, so that for high-voltage semiconductor components a dielectric layer 42 is required that has a high dielectric strength. The dielectric strength of the dielectric layer 42 can be increased by increasing the thickness of the dielectric layer 42. However with increasing thickness of the dielectric layer 42 higher recombination rate control voltages $V_C$ are required.

Figure 4:
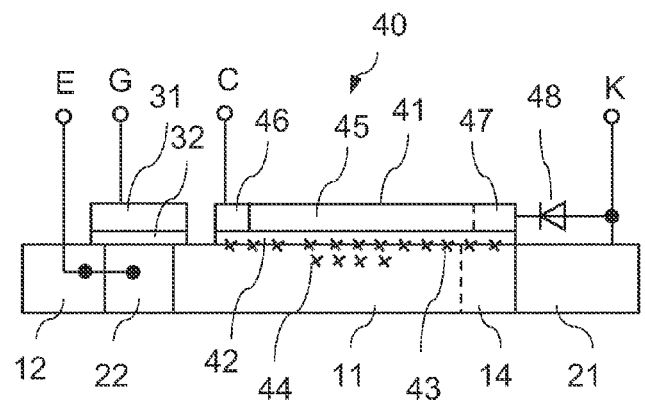
FIG. 4 illustrates a semiconductor component having a recombination rate control structure according to a further embodiment.

FIG. 4 illustrates a cross section through an embodiment of an IGBT in which the voltage applied to the dielectric layer 42 is reduced. While in the component according to FIG. 1 the control electrode is made of an electrically conducting material, such as a metal or a highly doped polycrystalline semiconductor material, such as polysilicon, the control electrode 41 of FIG. 4 is made of a monocrystalline semiconductor material and includes two complementarily doped semiconductor regions: a first semiconductor region 45, and a second semiconductor region 46, where a pn-junction is formed between the two semiconductor regions 45, 46. The control terminal C is connected to the second semiconductor region 46. The first and second semiconductor regions 45, 46 are arranged adjacent to one another in the current flow direction of the semiconductor component, where the second semiconductor region 46 is arranged in the direction of the first emitter region 12, and the second semiconductor region 45 is arranged in the direction of the second emitter region 21. The doping type of the first semiconductor region corresponds, for example, to the doping type of the first base region 11.

According to an embodiment the doping concentration of the first semiconductor region 45 is in the range of the doping concentration of the base region 11, whereas the doping concentration of the first semiconductor region 45 is, e.g., between 75% and 125%, in particular between 90% to 110%, of the doping concentration of the base region 11.

A rectifier element 48, such as a diode, is connected between the second emitter region 21, or the cathode terminal K, respectively, and the first semiconductor region 45. Optionally a contact zone 47 that is of the same doping type as the first semiconductor region 45, but that is more highly doped, is arranged between the first semiconductor region 45 and the rectifier element 48. The doping concentration of the first semiconductor region 45 is selected such that this semiconductor region 45 can be completely depleted of charge carriers when a space charge region propagates in the first semiconductor region 45, namely at least in those regions, where the first semiconductor region 45 is arranged adjacent to the base region 11. The operating principle of the recombination rate control structure 40 of FIG. 4 will now be explained. In this connection it is assumed that the first base region 11 and the first emitter region 12 are n-type semiconductor regions, that the second emitter region 21 and the second base region 22 are p-type semiconductor regions, that the first semiconductor region 45 is an n-type semiconductor region, and that the second semiconductor region 46 of the control electrode 41 is a p-type semiconductor region.

When the component is in its on-state the control electrode 41 acts as the control electrode that has been explained before with reference to FIGS. 1 to 3. In the on-state of the semiconductor component, the voltage drop across the load-path is—due to the low on-resistance—very low and in the range of, for example, between 1V and 5V. The voltage drop, however, is dependent on the load current. When applying a recombination rate control voltage $V_C$ the control electrode 41 on its entire length assumes the electrical potential of the control terminal C. The rectifier element 48 is connected such that the rectifier element 48 blocks when the control electrode 41 assumes a positive potential relative to the potential of the second emitter region 21. When the recombination rate control voltage $V_C$ assumes the second signal level, which is a low level in the present example, in order to increase the recombination rate, the electrical potential of the control electrode 41 corresponds to the electrical potential in the range of the first emitter region 12 to the second emitter region 21, or is slightly above or below this voltage. However, this potential is not sufficient to result in a depletion region that would reduce the recombination rate considerably (when there are no fixed charges in the dielectric layer 42). Due to the voltage drop along the base region that results from the voltage applied between the first and second emitter regions 12, 21 the width of the depletion region and, therefore, the recombination rate varies along the base region 11. However, on account of the control voltage the recombination rate can be set to significantly different values by setting a voltage applied to the control electrode 41.

When the component is switched off and a space charge region propagates in the first base region 11 the potential of the second emitter region 21 increases relative to the potential of the first emitter region 12. When the terminal of the control electrode C is kept on a constant potential, such as the emitter potential E, a space charge region also propagates in the first semiconductor region 45 starting from the pn-junction between the first and second semiconductor regions 45, 46. In this way, the voltage drop across the first base region 11 is about the same as the voltage drop across the first semiconductor region 45, so that the electrical potential in the first semiconductor region 45 follows the electrical potential in the first base region 11 in the current flow direction of the component. Thus, a voltage drop across the dielectric layer 42 in a direction perpendicular to the current flow direction is always lower than the load path voltage of the component. In an ideal case, in which the electrical potential at a given position in the current flow direction in the first semiconductor region 45 equals the electrical potential in the first base region 11 at the same position in the current flow direction, the voltage drop across the dielectric layer 42 can reach zero.

FIGS. 1 and 4 illustrate the basic structure of a recombination rate control structure 40 for controlling the recombination rate in a bipolar semiconductor component, such as an IGBT. This recombination rate control structure can be used in connection with any IGBT structure, such as lateral or vertical IGBTs. In lateral IGBTs, the current flow direction is a lateral direction of a semiconductor body in which active semiconductor regions, such as base and emitter regions of the semiconductor component are implemented. In a vertical component, the current flow direction is a vertical direction of the semiconductor body.

Figure 5:
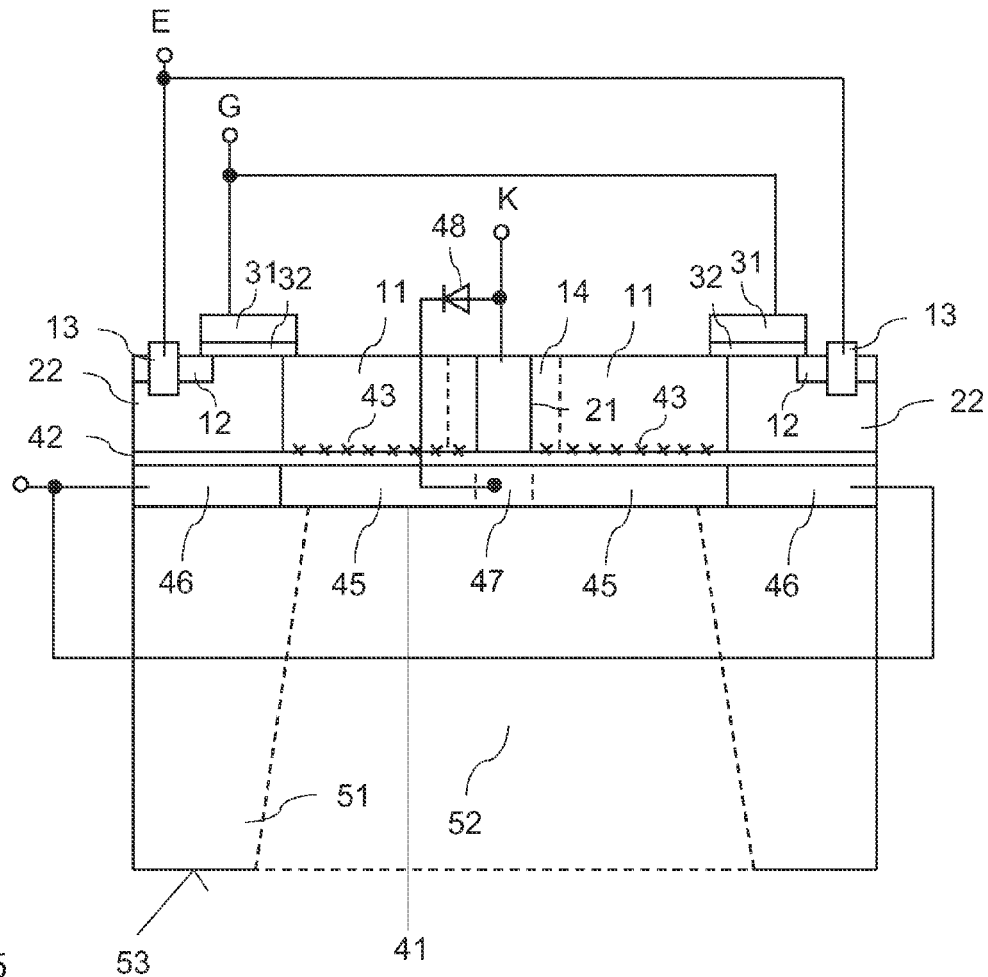
FIG. 5 illustrates a cross section through a lateral IGBT having a recombination rate control structure.

FIG. 5 illustrates a cross section through a lateral IGBT according to a first embodiment. In this component, the gate electrode 31 and the recombination rate control electrode 41 in a direction perpendicular to the current flow direction are arranged on opposite sides of the first base region 11. The recombination rate control electrode 41 extends from the body region 22 to the second emitter region 21, and overlaps the body region 22, the first base region 11, and the second emitter region 21 and is separated from these regions by the dielectric layer 42. The recombination rate control electrode 41 includes two complementarily doped first and second semiconductor regions 45, 46, where the dimension of the first semiconductor region 41 in the current flow direction corresponds to the dimension of the first base region 11, the dimension of the second semiconductor region 46 in the current flow direction corresponds to the dimension of the body region 22, and the dimension of the optional contact region 47 corresponds to the dimension of the second emitter region 21 in the current flow direction. The first emitter region 12 in a direction perpendicular to the current flow direction is arranged distant to the dielectric layer 42. An emitter electrode 13 that is connected to the emitter terminal E contacts both, the first emitter region 12 and the body region 22.

The semiconductor component of FIG. 5 includes two first emitter regions 12, two body regions 22, two gate electrodes 31 and two first base regions 11, each of these component regions being essentially arranged symmetrically relative to second emitter region 21. Correspondingly, the recombination rate control electrode 41 includes two first and second semiconductor regions 45, 46 that are arranged symmetrically relative to the optional contact region 47.

The arrangement with the IGBT structure and the recombination rate control structure is arranged on a semiconductor substrate 51, where the recombination rate control structure 40 is arranged adjacent to the semiconductor substrate 51, i.e., between the substrate 51 and the IGBT structure. The doping type of the substrate corresponds, for example, to the doping type of the second semiconductor region 46. Optionally substrate 51 has an opening 52 that from a surface 53 of the substrate 51 extends to the control electrode 41, so that the first semiconductor region 45 of the control electrode 41 is at least partly not covered by the substrate 51. In this case, substrate 51 may have any doping type and doping concentration. The doping of the base region 11 and the first semiconductor layer 45, however, should be low enough so as to accept the blocking voltage. Cavity 52 can be filled with a dielectric, such as air.

Figure 6:
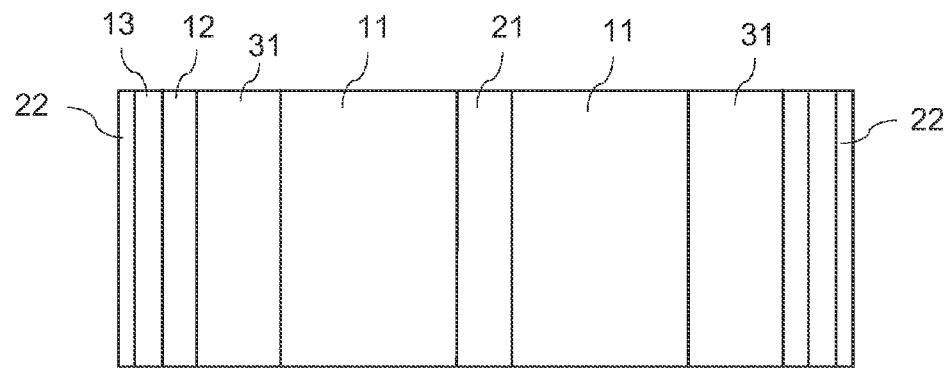
FIG. 6 illustrates a top-view on a lateral IGBT.

FIG. 6 illustrates a top view on an embodiment of a semiconductor component according to FIG. 5. In this embodiment, the second emitter region 21 is stripe-shaped. The first emitter region 12, the second base region 22 and the first base region 11 are arranged axial-symmetrical relative to the second emitter region 21. According to a further embodiment that is not illustrated, the second emitter region 21 has a circular, or a rectangular geometry, and the other component regions are arranged centro-symmetrical relative to this second emitter region 21.

Figure 7:
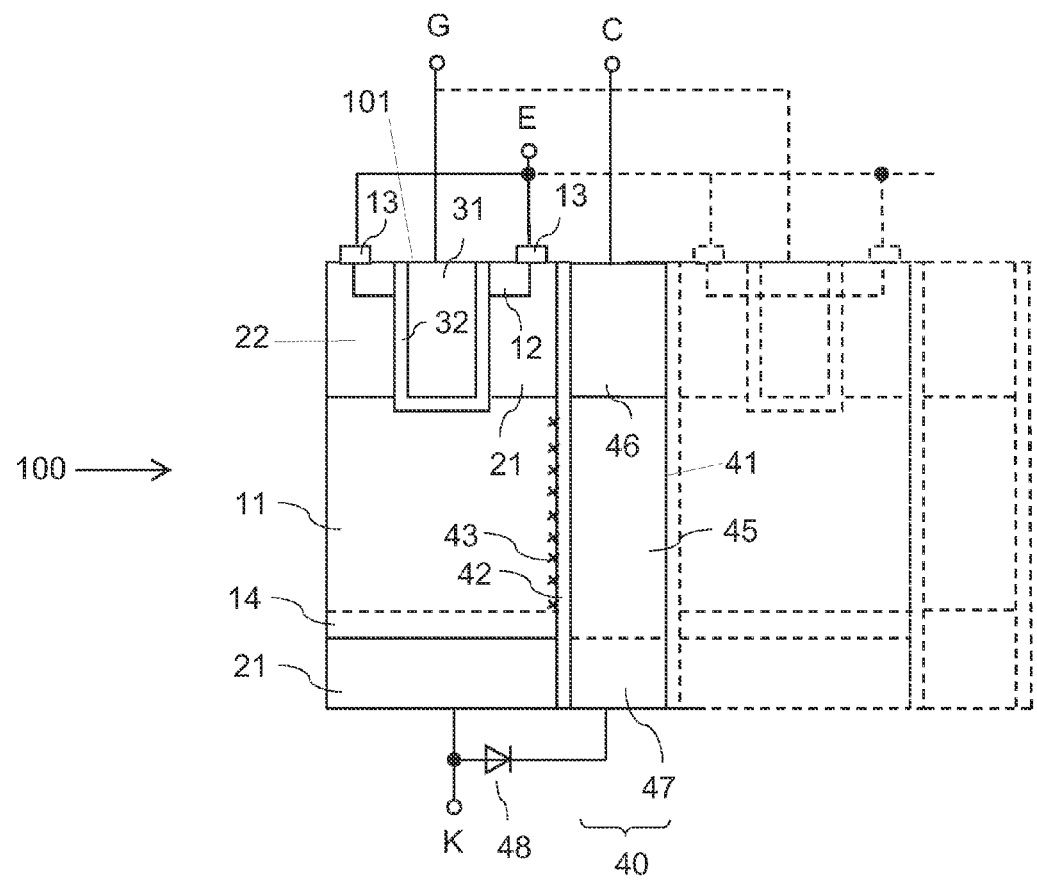
FIG. 7 illustrates a cross section through a vertical IGBT having a recombination rate control structure according to an embodiment.

FIG. 7 schematically illustrates a cross section through a vertical IGBT that has a recombination rate control structure 40. In this component the first emitter region 12, the second base region 22, the first base region 11, and the second emitter region 21 are arranged adjacent to one another in a vertical direction of a semiconductor body 100 in which these component regions are integrated. The IGBT illustrated is a trench transistor, i.e., its gate electrode 31 is arranged in a trench that, starting from a first surface 101 of the semiconductor body, extends through the first emitter region 12 and through the second base region 22 into the first base region 11. The semiconductor control structure 40 with the control electrode 41, the dielectric layer 42 and the recombination centers 43 is arranged adjacent to the first base region 11 in a lateral direction of the semiconductor body 100. In the embodiment illustrated in FIG. 7 the recombination rate control electrode 41 has a first semiconductor region 45 adjacent to the first base region 11, a second semiconductor region 46 adjacent to the body region 22 and contacted by the control terminal C, and an optional contact zone 47 adjacent to the second emitter region 22. The rectifier element 48 is connected between the second emitter region 22 and the first semiconductor region 45 or the contact zone 47, respectively.

In case the recombination rate control structure 40 is selected such that the control voltage applied to the control terminal C ranges between zero and negative voltages, diode 48 may be omitted, and contact zone 47 may be directly connected to the second emitter region 21 or cathode terminal K, respectively. This applies to each of the embodiments explained hereinbefore.

According to an embodiment, the transistor component has a cell structure with a plurality of identical IGBT structures and a plurality of recombination rate control structures, as it is illustrated in dashed lines in FIG. 7. The individual IGBT structures are connected in parallel with each other, and the individual recombination rate control structures are connected in parallel with each other.

Optionally the IGBTs illustrated in FIGS. 1, 4, 5 and 7 have a field-stop region 14 (illustrated in dashed lines) that is of the same doping type as the first base region 11, but more highly doped, and that is arranged in the first base region close to the second emitter region 21, or that is arranged between the first base region 11 and the second emitter region.

Figure 8:
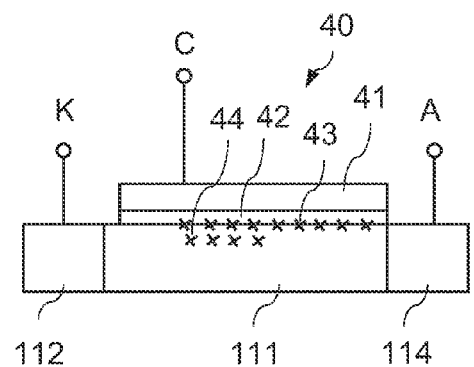
FIG. 8 illustrates an embodiment of a diode having a recombination rate control structure.

The principle explained hereinabove of controlling the recombination rate in a bipolar semiconductor component is not limited to be used in connection with an IGBT, but is suitable to be used in connection with any bipolar semiconductor component. FIG. 8 schematically illustrates a cross-section through a diode that has a recombination rate control structure 40. The diode includes an n-doped first emitter region 112 connected to a cathode terminal K, a p-doped second emitter region 114 connected to an anode terminal A, and a p-doped or n-doped first base region 111 between the first and second emitter region 112, 114. The recombination rate control structure 40 including a recombination rate control electrode 41, a dielectric layer 42, and recombination centers 43, 44 is arranged adjacent to the first base region 111. The explanations that have been made concerning the recombination rate control structure 40 hereinabove equivalently apply to the recombination rate control structure of the diode in FIG. 8. Like in the IGBT explained before the recombination rate control structure 40 is driven such that in the on-state of the diode the recombination increases a given time, such as time ΔT in FIG. 3, before the diode is switched off. Unlike an IGBT the on-state or off-state of a diode is not controlled through a control terminal, but is only controlled through the polarity of a voltage applied between the anode A and the cathode K terminal. The diode is in its on-state when a positive voltage is applied between the anode and the cathode terminals, and the diode is in its off-state when a negative voltage is applied between these terminals.

Figure 9:
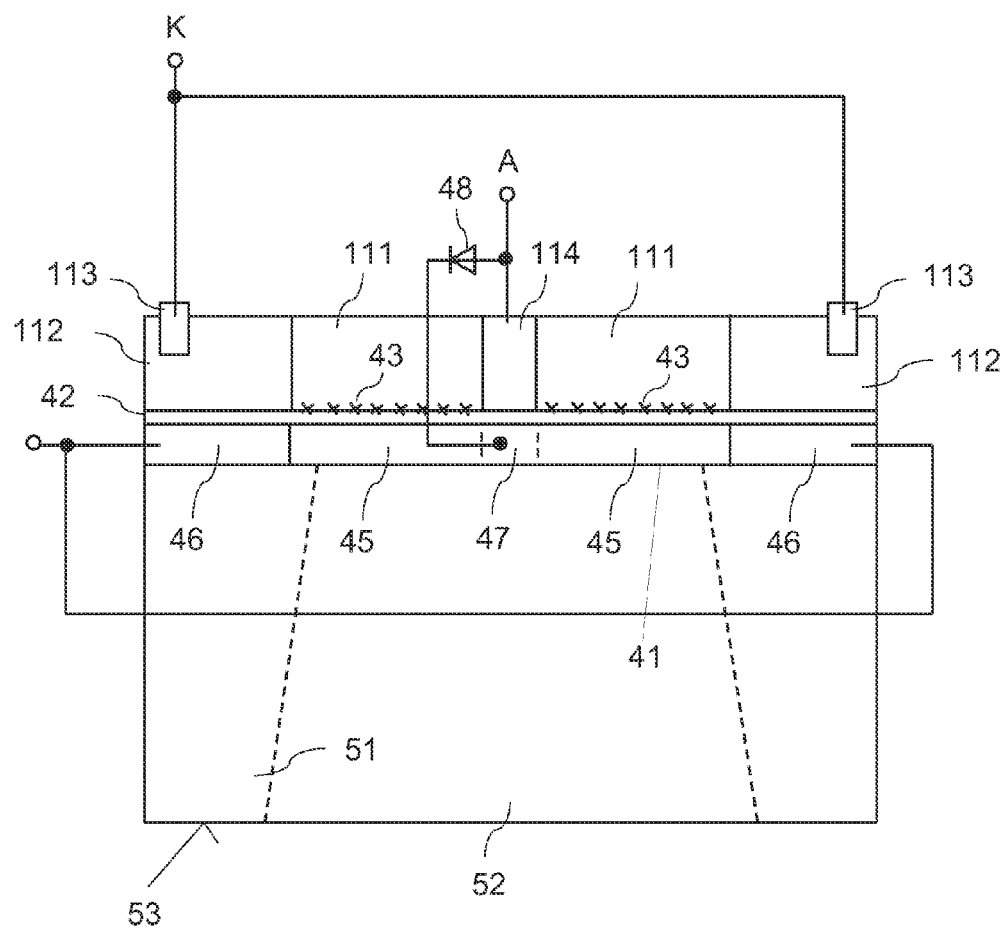
FIG. 9 illustrates an embodiment of a lateral diode having a recombination rate control structure.

FIG. 9 illustrates a cross section through a diode according to a further embodiment. The diode illustrated in FIG. 9 is a lateral diode. The structure of this diode is based on the IGBT structure illustrated in FIG. 5, i.e., the first emitter region 112 and the first base region 111 are arranged symmetrically relative to the second emitter region 114. The recombination rate control structure 40 is arranged below the first and second emitter regions 112, 114 and the first base region 111. The recombination rate control structure is arranged above a semiconductor substrate 51 that has an optional opening 52 below the second semiconductor region 45 of the recombination rate control structure.

Figure 10:
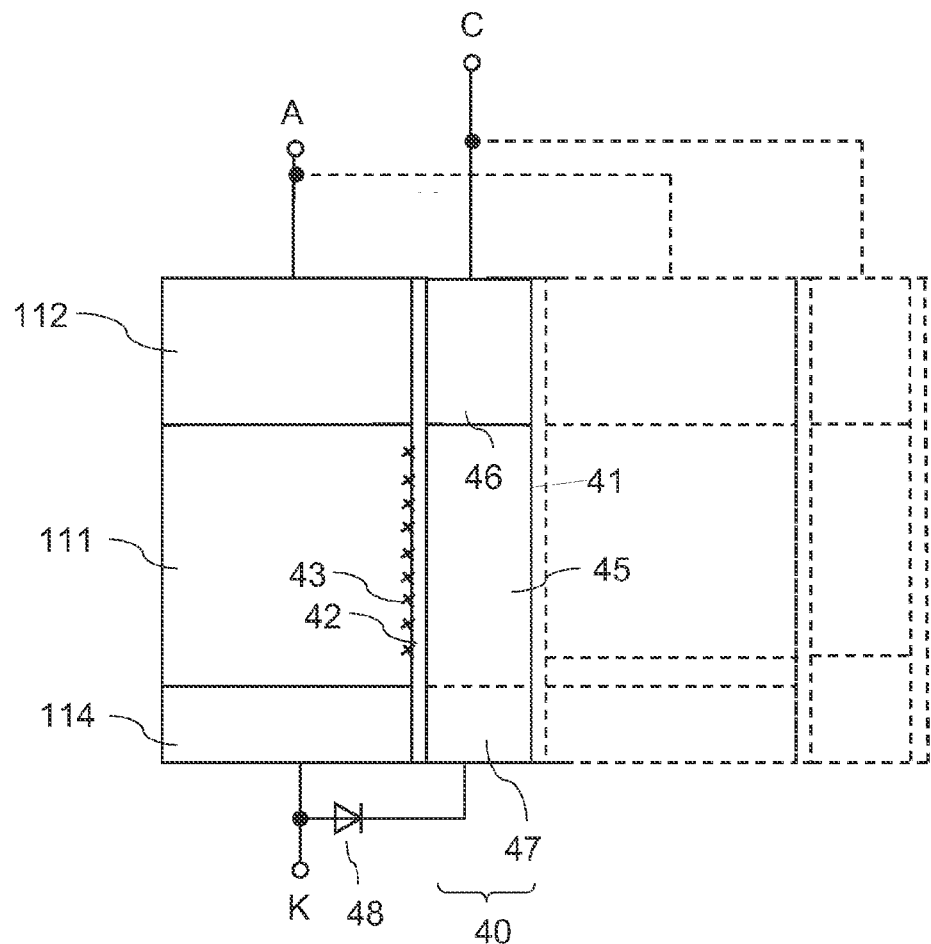
FIG. 10 illustrates an embodiment of a vertical diode having a recombination rate control structure.

FIG. 10 illustrates an embodiment of a vertical diode. The diode structure illustrated in FIG. 10 is based on the IGBT structure illustrated in FIG. 7, where the diode structure has a first emitter region 112 instead of the first emitter region 12 and the second base region 22 and the gate control structure.

Figure 11:
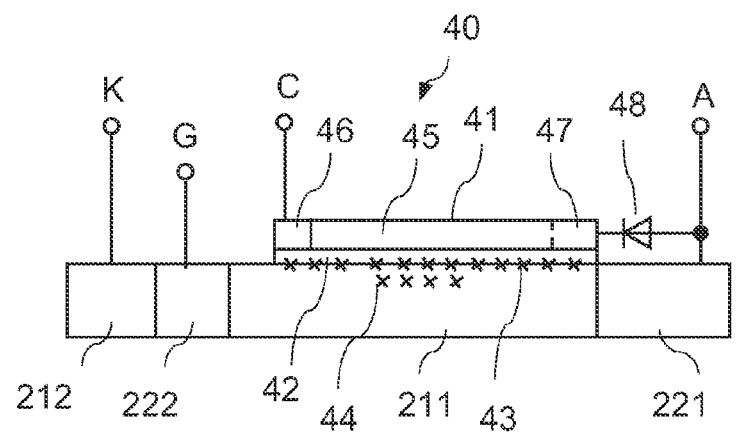
FIG. 11 illustrates an embodiment of a thyristor having a recombination rate control structure.

FIG. 11 schematically illustrates an embodiment of a thyristor, in particular a GTO (Gate Turn Off) thyristor, having a recombination rate control structure 40. Basically a thyristor is different from an IGBT in that the thyristor does not have a control structure for controlling an inversion channel in a second base region, but includes an ignition terminal or gate terminal, respectively, for igniting the component. Referring to FIG. 11 the thyristor has an n-doped first emitter region 212 connected to a terminal for thyristors/GTOs called cathode K, a p-doped second emitter region 221 connected to an terminal called anode A, an n-doped first base region 211 adjacent to the second emitter regions 221, and a p-doped second base region 222 between the first emitter region 212 and the first base region 211. The recombination rate control structure 40 is arranged adjacent to the first base region 211. The gate terminal G is connected to the second base region 222.

Each of the bipolar components explained hereinabove may include emitter shorts, which locally short-circuit the respective emitter region.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A bipolar semiconductor component operable to enter an on-state or an off-state, the component comprising:
    a base region that is adapted in the on-state to accommodate a charge carrier plasma with p-type and n-type charge carriers;
    a recombination rate control structure, the control structure comprising a dielectric layer adjoining the base region, a control electrode separated from the base region by the dielectric layer, and recombination centers; and
    a drive circuit for the recombination rate control structure that is adapted to apply a control voltage between the control electrode and the base region, based on a transition between the on-state and the off-state in the component, the control voltage being selected such that an electric field is generated in the base region that reduces the concentration of charge carriers of one of the p-type and n-type type in the region of the recombination centers.

2. The component of claim 1, wherein the recombination centers are present in an interface region between the dielectric layer and the base region.

3. The component of claim 1, wherein recombination centers are present in the base region distant to the dielectric layer.

4. The component of claim 1, wherein the recombination centers comprise at least one of dangling bonds of the semiconductor crystal, $P_b$ or $P_{b0}$ centers, crystal damage, or heavy metal atoms.

5. The component of claim 1, wherein the dielectric layer of the recombination rate control structure comprises at least one of an oxide layer, a nitride layer, or an oxynitride layer.

6. The component of claim 1, wherein fixed electrical charges are present in the dielectric layer.

7. The component of claim 1, wherein the semiconductor component is a diode.

8. A bipolar semiconductor component operable to enter an on-state or an off-state, the component comprising:
    a base region that is adapted in the on-state to accommodate a charge carrier plasma with p-type and n-type charge carriers;
    a recombination rate control structure, the control structure comprising a dielectric layer adjoining the base region, a control electrode separated from the base region by the dielectric layer, and recombination centers, wherein the control electrode comprises a first and second control electrode region that are made of a semiconductor material and that are complementarily doped and a control terminal contacting the second control electrode region; and
    a first and a second emitter that are complementarily doped, the base region being arranged between the first and second emitter.

9. The component of claim 8, further comprising:
    a rectifier element connected between the second emitter region and the first control electrode region.

10. The component of claim 8, wherein a doping concentration of the first control electrode region is selected such that the first control electrode region can be completely depleted of charge carriers.

11. The component of claim 8, wherein the dielectric layer of the recombination rate control structure comprises at least one of an oxide layer, a nitride layer, or an oxynitride layer.

12. The component of claim 8, wherein fixed electrical charges are present in the dielectric layer.

13. An IGBT operable to enter an on-state or an off-state, the component comprising:
    a base region that is adapted in the on-state to accommodate a charge carrier plasma with p-type and n-type charge carriers; and a recombination rate control structure, the control structure comprising a dielectric layer adjoining the base region, a control electrode separated from the base region by the dielectric layer, and recombination centers; and a first and a second emitter that are complementarily doped, the base region being arranged between the first and second emitter; and a switching control structure comprising a second base region arranged between the base region and the first emitter region, a gate electrode arranged adjacent to the second base region and insulated from the second base region by a gate dielectric.

14. The component of claim 13, wherein a doping concentration of the first control electrode region is selected such that the first control electrode region can be completely depleted of charge carriers.

15. The component of claim 13, wherein the dielectric layer of the recombination rate control structure comprises at least one of an oxide layer, a nitride layer, or an oxynitride layer.

16. The component of claim 13, wherein fixed electrical charges are present in the dielectric layer.

17. A thyristor operable to enter an on-state or an off-state, the component comprising:

a base region that is adapted in the on-state to accommodate a charge carrier plasma with p-type and n-type charge carriers; and a recombination rate control structure, the control structure comprising a dielectric layer adjoining the base region, a control electrode separated from the base region by the dielectric layer, and recombination centers; and a first and a second emitter that are complementarily doped, the base region being arranged between the first and second emitter; and a switching control structure comprising a second base region arranged between the base region and the first emitter region.

18. The component of claim 17, wherein a doping concentration of the first control electrode region is selected such that the first control electrode region can be completely depleted of charge carriers.

19. The component of claim 17, wherein the dielectric layer of the recombination rate control structure comprises at least one of an oxide layer, a nitride layer, or an oxynitride layer.

20. The component of claim 17, wherein fixed electrical charges are present in the dielectric layer.

* * * * *